United States Patent [19]

Ho-sun

[11] Patent Number: 5,117,235

[45] Date of Patent: May 26, 1992

[54] FEEDBACK COMPARISON TYPE ANALOG-TO-DIGITAL CONVERTER

[75] Inventor: Jeong Ho-sun, Taegu, Rep. of Korea

[73] Assignee: Samsung Electronics Co., Ltd., Rep. of Korea

[21] Appl. No.: 473,631

[22] Filed: Feb. 1, 1990

[30] Foreign Application Priority Data

Feb. 2, 1989 [KR] Rep. of Korea ............... 89-1367

[51] Int. Cl.$^5$ ............................................. H03M 1/36
[52] U.S. Cl. .................................... 341/159; 341/136; 341/158; 341/155; 341/163
[58] Field of Search ............... 341/136, 159, 158, 155, 341/163

[56] References Cited

U.S. PATENT DOCUMENTS

| | | | |
|---|---|---|---|
| 4,331,892 | 5/1982 | Miskin et al. ................. | 341/136 |
| 4,635,038 | 1/1987 | Wincn ............................ | 341/136 |
| 4,924,227 | 5/1990 | Mangelsdorf ................. | 341/159 |
| 4,926,180 | 5/1990 | Anastassiou .................. | 341/159 |

FOREIGN PATENT DOCUMENTS

| | | | |
|---|---|---|---|
| 0316223 | 5/1989 | European Pat. Off. ............ | 341/158 |
| 0041526 | 2/1989 | Japan ................................... | 341/136 |
| 2126815 | 3/1984 | United Kingdom ................ | 341/159 |
| 2206009 | 12/1988 | United Kingdom ................ | 341/136 |

Primary Examiner—Benjamin R. Fuller
Assistant Examiner—Nancy Le
Attorney, Agent, or Firm—Cushman, Darby & Cushman

[57] ABSTRACT

An analog-to-digital converter comprises plural amplifiers, a first group of transistors for input, a second group of transistor for biasing, a third group of transistors for feedback and plural inverters. The first group of transistors are PMOS transistors, and the second and third groups of transistors are NMOS transistors. The connecting weight of each transistor may be set with the conductance values thereof in accordance with a geometrical aspect ratio W/L of MOS transistors. The amplifiers comprise two CMOS inverters connected in series.

5 Claims, 2 Drawing Sheets

FEEDBACK COMPARISON TYPE ANALOG-TO-DIGITAL CONVERTER

BACKGROUND OF THE INVENTION

The present invention relates to an analog-to-digital converter (hereinafter, "ADC"), and more particularly to a feedback comparison type ADC.

PRIOR ART

Most of the information used by humans are of analog values, while most of the data processed by a variety of computers are of digital values. Therefore, it is essential to convert data having analog values to data having digital values to permit effective interaction between humans and computers.

Many different ADCs have been developed for specific applications in certain technologies.

There are generally two types of conversion methods employed by ADCs: an integration method and a comparison method. The converters using the integration method can be sub-divided into a voltage-time conversion type and a voltage-frequency conversion type. The converters using the comparison method can be sub-divided into a feedback comparison type and a non-feedback comparison type (see, "A User's Hand-book of D/A and A/D converter", DCA Reliability Laboratory Inc., Eugen R. Hantek; "Analog to digital/Digital to Analog Conversion Techniques", David P. Hoeschele, Jr., John Wiley & Sons). ADCs employing a comparison method have much faster conversion speeds than the ADCs using integration methods. Therefore, the comparison method ADCs may be used for high conversion speed, such as image processing.

A full-parallel comparison type ADC is a circuit including a row of reference resistors, voltage comparators, and an encoder. However, when such a circuit is actually made into an integrated circuit, the circuit has a drawback in that chip areas are larger to accommodate the resistor rows. In addition, because chip areas are increased, operation speed of the circuit is slow and power consumption is large.

In 1986, J. J. Hopfield and D. W. Tank proposed an ADC using a neural network as an example, presenting a model to solve an optimization problem (D. W. Thank and J. J. Hopfield, IEEE Transactions on circuit and systems, Vol, CAS-33, No. 5, May 1986).

However, with ADCs using the Hopfield model, a number of local minima remain in relation with each status, so that the ADC circuits are unstable. Conventionally, correction circuits may be designed to overcome such unstabilities of the ADC circuits, but the sizes of the correction circuits are large.

SUMMARY OF THE INVENTION

An object of the present invention is to provide an ADC with a simple circuit as well as with a fast conversion speed.

Another object of the present invention is to provide a new ADC using a unidirectional feedback type (UFT) arrangement.

In order to achieve the above-mentioned objects, an ADC to convert analog signals to N-bit of digital signals according to the present invention comprises plural amplifiers corresponding to each bit of the digital signals. A first group of transistors couple a first power source in common with an input line of each amplifier. This first group of transistors have a connecting weight of 1 to 2 in accordance with the level change of the analog signals.

A second group of transistors for biasing connect a second power source in common with the input line of the amplifiers, and have a connecting weight with weighting value of each bit of N-bits when applying said first power source.

A third group of transistors for feedback connect the second power source in common with the input line of LSB amplifiers, and have a connecting weight with weighting value of an output bit in accordance with the output of each MSB amplifier of said amplifiers. Plural inverters are coupled to the output of the amplifiers.

The first group of transistors are PMOS transistors, and the second and third groups of transistors are NMOS transistors. Each connecting weight of each transistor may be set with the conductance values of MOS transistors in accordance with a geometrical aspect ratio W/L of MOS transistors.

The geometrical parameter W/L which is ratio of the channel width W to the length L of the MOS transistor specifies its conductance.

The present invention as described above decreases by half the number of transistors used in the third group in comparison with that the Hopfield method. Further, the connecting weight of each transistor is set to the conductance value of the MOS transistor so that the circuit areas are minimized and a stable value is be held in relation to each state when realizing a VLSI component.

BRIEF DESCRIPTION OF THE DRAWINGS

Other objects and advantages of the present invention will be readily appreciated as the present invention becomes better understood with reference to the following detailed description when considered in connection with the accompanying drawings.

DETAILED DESCRIPTION OF THE PREFERRED EMBODIMENT

Figure 1:
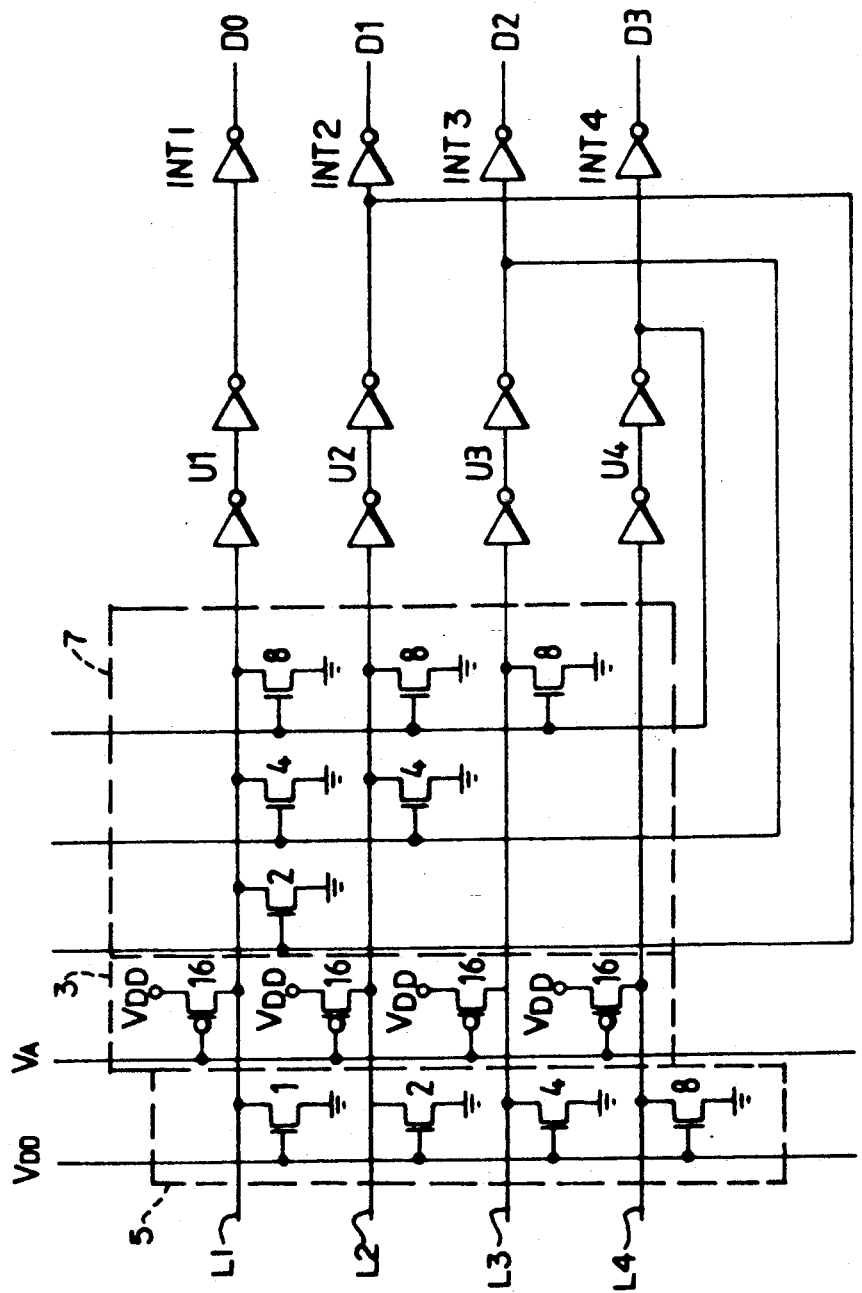
FIG. 1 is a circuit diagram showing an embodiment of an ADC according to the present invention.

A 4bit ADC is shown in FIG. 1 in which the 4bit ADC may convert analog signals to digital signals with a resolution of $2^4 = 16$ steps.

As shown in FIG. 1, a 4bit ADC largely comprises a portion for input, a portion for output, and a portion for feedback. The portion for output comprises buffer amplifiers U1 to U4 corresponding to each output bit. Each of the buffer amplifiers U1 to U4 comprises two CMOS inverters connected in series. Four CMOS inverters INT1 to INT4 invert each output of the buffer amplifiers U1 to U4 for the purpose of applying the output to each output terminal D0 to D3.

In the input portion, a first power source $V_{DD}$ is applied to source electrodes and an analog signal from input VA is applied to gate electrodes of four PMOS transistors 3. Drain electrodes of the four PMOS transistor 3 are connected to each input line L1 to L4 of respective buffer amplifiers U1 to U4.

The PMOS transistors 3 have a connecting weight corresponding to the desired digital resolution value of the analog signal. In this embodiment, a maximum amplitude of an analog signal may be divided into 16 steps, with each step representing a 4bit binary number of (i.e., $2^4=16$). For example, 32 steps represent a 5bit binary number ($32=2^5$), 64 steps represents a 6bit binary number ($64=2^6$), 128 steps represents a 7bit binary number ($128=2^7$), and 256 steps represents an 8bit binary number ($256=2^8$).

The connecting weight of the PMOS transistors 3 (for example, 16) may be set with a conductance value determined by a geometrical aspect ratio W/L of MOS transistors.

Four NMOS transistors 5 bias each input line L1 to L4. The first power source $V_{DD}$ is coupled to the gates of the NMOS transistor 5. The drains of the NMOS transistors 5 are connected between respective lines L1 to L4 of the buffer amplifiers U1 to U4. The sources are connected to a second power source (ground potential).

The conductance values 1, 2, 4 and 8 of the NMOS transistors 5 provide a connecting weight corresponding to a respective output bit.

The feedback portion provides for outputs of amplifiers corresponding to higher order bits to be fedback to an input line of the amplifiers corresponding to the lower order bits to add connecting weight of weighting value of an output bit.

The feedback portion comprises six NMOS transistors 7 in which the second power source (ground potential) is applied to the source electrodes, and the outputs of the amplifiers of the higher order bits are coupled to the gate electrodes, and the input lines L1 to L3 are applied respectively to the drain electrodes. The MNOS transistors 7 have weighting values of the output of the higher order bit amplifiers fedback thereto. For example, attached to the input line L1 of the LSB amplifier U1 are an NMOS transistor having a weighting value of 2 which corresponds to the second bit amplifier U2, an NMOS transistor having a weighting value of 4 which corresponds to the third bit amplifier U3, and an NMOS transistor having a weighting value of 8 which corresponds to the MSB amplifier U4. Two NMOS transistors having conductance values of 4 and 8 are connected to the input line L2, a second bit amplifier U2 and an NMOS transistor having conductance value of 8 is connected to the input line L3 of a third bit amplifier U3. The conductance values of the NMOS transistors 7 are decided by the geometrical aspect ratio W/L of the MOS transistors.

Following the arrangement of one embodiment according to the present invention, the function and effect thereof will now be explained.

First, in the case where the analog input is at the 0 step, the PMOS transistors 3 are turned on with conductance value of 16. The conductance ratio of the input line L4 of the MSB amplifier U4 has the difference of 8 resulting in PMOS:NMOS=16:8. The conductance ratio of the input line L3 of a the third bit amplifier U3 has a difference of 4 resulting in PMOS:NMOS=16:12. The conductance ratio of the input line L2 of the second bit amplifier U2 has a difference of 2 resulting in PMOS:NMOS=16:14. The conductance ratio of the input L1 of the LSB amplifier U1 has a difference of 1 resulting in PMOS:NMOS=16:15. Therefore, each of the input lines L1 to L4 has the difference in conductance value by 1, 2, 4 and 8, respectively, so that the output value of the amplifiers U1 to U4 is 1111 and the output value of the inverters INT1 to INT4 is 0000.

When the input VA is increased to 1, the input lines L1 to L4 of the amplifiers U1 to U4 have the differences 0, 1, 3 and 7 in conductance values, respectively, the consequence that each value of the outputs D0 to D3 becomes 0001. When the input VA is increased to 15, the input lines L1 to L4 of the amplifiers U1 to U4 have the differences 0, $-1$, $-3$ and $-7$ in the conductance values, respectively, with the consequence that each value of the outputs D0 to D3 becomes 1111.

The values of the outputs D0 to D3 to each input VA is summarized in Table 1.

TABLE 1

| Analog Input | Process of the Circuit Operation | | | | | | | |
|---|---|---|---|---|---|---|---|---|
| | Analog value of amplifier input | | | | Digital value of output end | | | |
| | MSB | D2 | D1 | LSB | MSB | D2 | D1 | LSB |
| 0 | 8 | 4 | 2 | 1 | 1 | 1 | 1 | 1 |
| 1 | 7 | 3 | 1 | 0 | 1 | 1 | 1 | 0 |
| 2 | 6 | 2 | 0 | $-1 \to 1$ | 1 | 1 | 0 | 1 |
| 3 | 5 | 1 | $-1$ | 0 | 1 | 1 | 0 | 0 |
| 4 | 4 | 0 | $-2 \to -2$ | $-1 \to -1$ | 1 | 0 | 1 | 1 |
| 5 | 3 | $-1$ | 1 | 0 | 1 | 0 | 1 | 0 |
| 6 | 2 | $-2$ | 0 | $-1 \to -1$ | 1 | 0 | 0 | 1 |
| 7 | 1 | 3 | $-1$ | 0 | 1 | 0 | 0 | 0 |
| 8 | 0 | $-4 \to -4$ | $-2 \to -2$ | $-1 \to -1$ | 0 | 1 | 1 | 1 |
| 9 | $-1$ | 3 | 1 | 0 | 0 | 1 | 1 | 0 |
| 10 | $-2$ | 2 | 0 | $-1 \to -1$ | 0 | 1 | 0 | 1 |
| 11 | $-3$ | 1 | $-1$ | 0 | 0 | 1 | 0 | 0 |
| 12 | $-4$ | 0 | $-2 \to -2$ | $-1 \to -1$ | 0 | 0 | 1 | 1 |
| 13 | $-5$ | $-1$ | 1 | 0 | 0 | 0 | 1 | 0 |
| 14 | $-6$ | $-2$ | 0 | $-1 \to -1$ | 0 | 0 | 0 | 1 |
| 15 | $-7$ | $-3$ | $-1$ | 0 | 0 | 0 | 0 | 0 |

Figure 2:
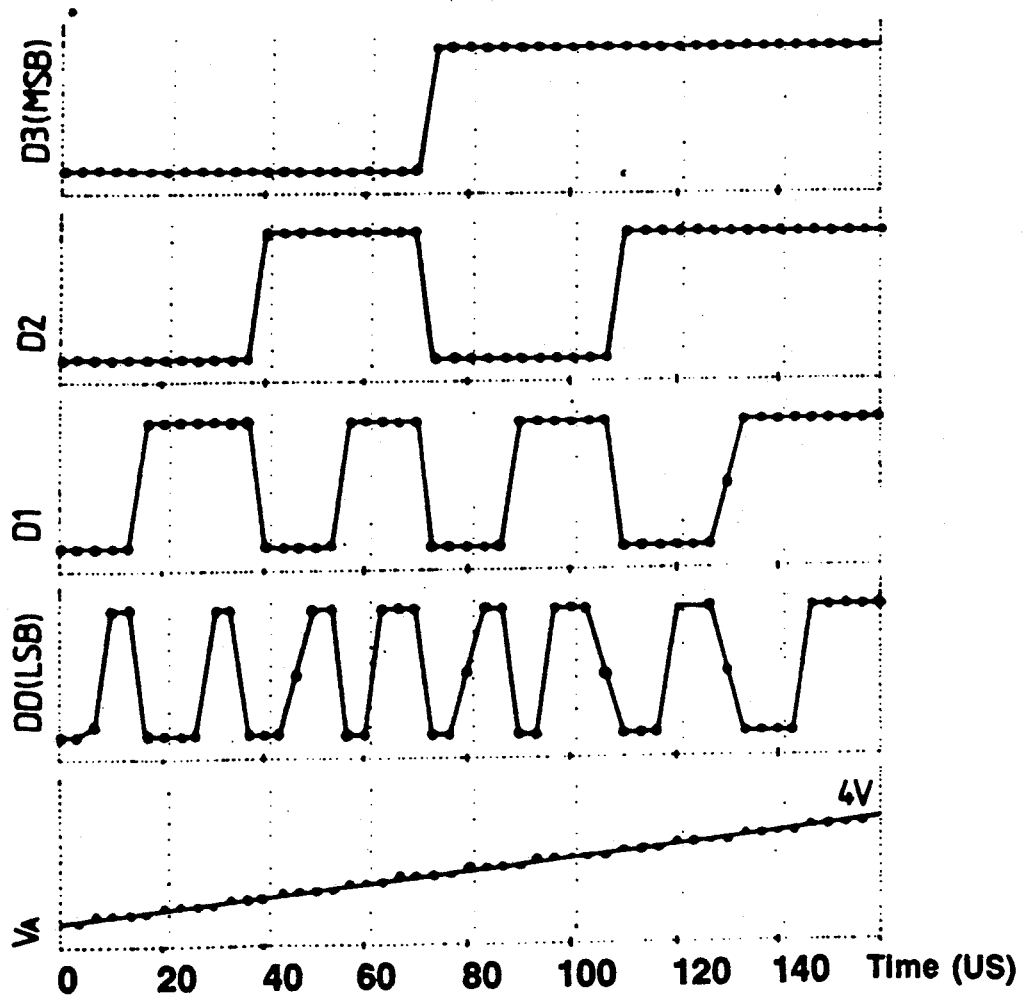
FIG. 2 is a waveform showing an output to an input for arranging the circuit 4bit ADC shown in FIG. 1 with a rule of design such as 3 $\mu$m CMOS single metal.

FIG. 2 shows the waveforms of the output of each data line D0–D3 and the input VA of the 4bit ADC shown in FIG. 1. The rule of design for 3 $\mu$m CMOS single metal was used.

It can be understood as described above that one output to one input has the final stable state as represented in the Table 1 according to the present invention. Therefore, the ADC according to the present invention may be operated stably without requiring any correction circuits as compared to the ADC proposed by Hopfield, and also a simpler circuit may be constructed in that the number of NMOS transistors used in the feedback portion are decreased by half. Obviously, various modifications and variations of the present invention can be made in the light of above teachings. It is therefore to be understood that, within the scope of appended claims, the present invention may be practiced otherwise than as specifically described.

What is claimed is:

1. An analog to digital converter which converts analog signals into Nbit digital signals comprising;
   a plurality of amplifiers corresponding to each bit of said digital signals, each of said amplifiers having a corresponding input line;
   a first group of transistors for connecting a first power source in common with each said input line of said amplifiers, having a connecting weight in accordance with a level change of said analog signals;
   a second group of transistors for connecting a second power source in common with each said input line of said amplifiers, said second group of transistors having connecting weights with weighting values of each bit of Nbits when applying said first power source;
   a third group of transistors for selectively connecting said second power source in common with each said input line of the amplifiers corresponding to lower order bits in accordance with output values output from the amplifiers corresponding to higher order bits, said third group of transistors having connecting weights with weighting values indicative of the output of the amplifiers corresponding to the higher order bits;
   a plurality of inverters for inverting each output of said amplifiers.

2. An analog to digital converter according to claim 1,
   wherein said first group of transistors are PMOS transistors and said second and third groups of transistors are NMOS transistors.

3. An analog to digital converter according to claim 2,
   wherein said connecting weight of each said transistor corresponds to a conductance value thereof.

4. An analog to digital converter according to claim 3, wherein said conductance value of each said transistor is set with a geometrical aspect ratio W/L.

5. An analog to digital converter according to claim 1, wherein each said amplifier comprises two CMOS inverters connected in series.

* * * * *